United States Patent
Gorshe

(10) Patent No.: US 7,802,167 B1
(45) Date of Patent: Sep. 21, 2010

(54) APPARATUS AND METHOD FOR DETECTING EXTENDED ERROR BURSTS

(75) Inventor: Steven Scott Gorshe, Beaverton, OR (US)

(73) Assignee: PMC-Sierra US, Inc., Santa Clara, CA (US)

( * ) Notice: Subject to any disclaimer, the term of this patent is extended or adjusted under 35 U.S.C. 154(b) by 904 days.

(21) Appl. No.: 11/669,479

(22) Filed: Jan. 31, 2007

Related U.S. Application Data

(60) Provisional application No. 60/771,114, filed on Feb. 8, 2006.

(51) Int. Cl.
*H03M 13/00* (2006.01)
(52) U.S. Cl. .................................. 714/762
(58) Field of Classification Search ............ 714/704, 714/747, 755, 758, 762, 788
See application file for complete search history.

(56) References Cited

U.S. PATENT DOCUMENTS

| | | | | |
|---|---|---|---|---|
| 4,188,616 A | * | 2/1980 | Kazami et al. | 714/762 |
| 5,491,701 A | * | 2/1996 | Zook | 714/762 |
| 5,724,369 A | * | 3/1998 | Brailean et al. | 714/747 |

* cited by examiner

*Primary Examiner*—Shelly A Chase
(74) *Attorney, Agent, or Firm*—Dennis R. Haszko

(57) ABSTRACT

A system and method are provided to detect an extended error burst in a data interface. An original error burst has a given length prior to or during transmission. Data transmission processing can extend the original error burst beyond its original length to become an extended error burst with an effective length greater than the original error burst length. Such data transmission processing can include: de-interleaving data on a multi-lane data interface; feedback from a Decision Feedback Equalizer (DFE) receiver; and/or block line decoding, such as 8B/10B block line code decoding. An extended error burst detector can include a suitable error detecting code, such as an r-bit cyclic redundancy check (CRC) code developed in relation to known extended error burst patterns, to detect all extended error bursts based on an up to r-bit original error burst. The detector can also detect error bursts that are not extended beyond the original error burst length.

23 Claims, 11 Drawing Sheets

Data on lane *x* with an error burst that spans two characters

*n*   Resulting error spread (extended error burst) in the packet

1

2

4

8

16

*n* = the number of data lanes errored characters

APPARATUS AND METHOD FOR DETECTING EXTENDED ERROR BURSTS

CROSS REFERENCE TO RELATED APPLICATIONS

This application claims the benefit of priority of U.S. Provisional Patent Application No. 60/771,114 filed Feb. 8, 2006, which is incorporated herein by reference.

FIELD OF THE INVENTION

The present invention relates generally to data communications and error detection. More particularly, the present invention relates to detecting error bursts that are extended beyond an original error burst length.

BACKGROUND OF THE INVENTION

Error detecting codes such as Cyclic Redundancy Check (CRC) codes are commonly used to detect errors in data sent either in packets or blocks. A CRC-r is a linear, cyclic, r-bit check code that is appended to an original data block. A CRC-r code can typically guarantee detection of some small number of randomly-occurring single bit errors in the data block (e.g., up to 4) or a single burst with a length of up to r errors. The length of an error burst is defined as the number of bits from the first errored bit to the last errored bit in the string, including these first and last errored bits. The bits between the first and last errored bits in the burst can contain errors or valid data.

An error burst can be extended beyond an original error burst length due to transmission processing. Examples of such transmission processing include: de-interleaving data on a multi-lane data interface; feedback from a Decision Feedback Equalizer (DFE) receiver; and block line decoding, such as 8B/10B block line code decoding.

A DFE receiver uses feedback about the decisions it has made regarding the value of some number of received bits to allow a better decision regarding the value of the current received bit. While a DFE is very effective in removing the effects of some types of noise/impairments, the effects of an incorrect decision can propagate through the feedback mechanism to cause additional decision errors in some subsequently received bits. As a result, a single transmission channel bit error can be converted or multiplied into a burst of errors. DFE-receivers are one important source of error bursts.

Another source of error extension or multiplication is the decoding process of an 8B/10B block line code. The 8B/10B code is a block code that converts a block of 8 bits (e.g., a byte) into a 10-bit code for transmission. The most typical 8B/10B codes actually consist of two sub-codes, where the original eight bits are divided into a 3-bit and 5-bit pair of groups that are then encoded into a 4-bit and 6-bit pair of groups, respectively. The resulting 10-bit code has certain desirable properties such as limiting the number of consecutive data 0s or 1s that are transmitted, and achieving a running balance between the number of 0s and 1s that are transmitted. A property of 8B/10B decoding, however, is that a single transmission channel error will cause the entire sub-code to be improperly decoded, causing a burst of up to three or five bit errors. If the 8B/10B decoding is performed after a DFE receiver, the combination of the DFE and 8B/10B decoder error multiplication can further stretch the error burst.

In a multi-lane data interface, the interface data source interleaves the data across the multiple transmitters. The interleaving is typically done on a byte-by-byte basis (or 10-bit character basis if the 8B/10B line code is used). A 4-lane interface using byte/character interleaving is illustrated in FIGS. 1 and 2. FIG. 1 illustrates the manner in which data characters are interleaved and reassembled when going across a multi-lane interface. FIG. 2 illustrates points in an end-to-end connection at which the 8B/10B encoding/decoding and error check code insertion/checking are performed. In the example in FIG. 1, the characters that are sent over the first lane are shown in bold in order to highlight their relative positions in the data stream recovered after de-interleaving. If, in this example, an error burst occurs in the first lane that corrupts bytes 1 and 5, a burst of up to 16 bits is created at the output of that lane's receiver. However, the error burst in the re-assembled data block will be up to 40 bits long due to bytes 2-4 being re-inserted by the de-interleaving process. While a CRC-16, for example, is guaranteed to detect any error burst of up to 16 bits, it is not guaranteed to detect an error burst of up to 40 bits.

Error bursts that are spread by a multi-lane data interface are not specifically addressed by any existing error detecting code. An advantage of the CRC is that it is relatively easy and economical to implement the CRC encoder and decoder. The only codes that are known to detect these longer error bursts are either CRC codes of longer length, or more complicated error-detecting codes such as the Reed-Solomon code. A longer-length CRC begins to consume too much bandwidth as the number of lanes increases. A CRC-40 would be required for the 4-lane example in FIGS. 1 and 2, and a CRC-272 would be required for a 16-lane interface. The more complicated error-detecting codes add significant complexity and power consumption to the circuits.

Currently identified CRC codes have very limited capability for detecting extended error bursts such as can be created through byte/character de-interleaving on multi-lane data interfaces. The problem is more severe when 8B/10B block line codes are used. When DFE receivers are used on each data lane, error bursts become more common since the bursts can be induced by a single line error. Only significantly longer CRC codes or more powerful/complex codes are known to work. One problem is to identify a CRC capable of detecting these error bursts such that the new CRC code is no longer than the CRC originally chosen for the packet. The original CRC is typically a CRC-16 or CRC-32, but can be a length optimized for the application (e.g., a CRC-13).

As data interface rates increase, both parallel data lanes and DFE receivers are becoming increasingly important. Existing error detecting codes have not been created to handle the error bursts and extended error bursts that can result from this combination, especially when block line codes are being used. It is, therefore, desirable to provide error detection that is capable of detecting the types of extended error bursts that can result from DFE receiver mis-decoding, 8B/10B block decoding, and/or multi-lane data interface.

SUMMARY OF THE INVENTION

It is an object of the present invention to obviate or mitigate at least one disadvantage of previous error detection schemes. The present invention preserves the error detecting capability of CRC codes without increasing the number of error correcting check symbol bits. The present novel type of error detector and error detecting code can be introduced to new interfaces wherever such error detection capability is required.

In a first aspect, the present invention provides a receiver for use in a data interface, including a data stream input to receive a transmission processed data stream. An extended error burst detector is provided, in communication with the data stream input, to detect an extended error burst in the received transmission processed data stream, the extended error burst having been extended beyond an original error burst length due to data transmission processing. An error-checked data stream output is provided, in communication with the extended error burst detector, to output an error-checked data stream to a data destination.

The extended error burst detector can include an r-bit error detecting code capable of detecting the extended error burst, where the original error burst is up to r bits long and the extended error burst is greater than r bits long. The r-bit error detecting code can be capable of detecting the extended error burst where the extended error burst is due to one or more of the following, including the interaction of one data transmission cause with one or both of the others: the extended error burst is due to character de-interleaving in a multi-lane data interface; the extended error burst is due to a decision feedback equalizer receiver; and/or the extended error burst is due to block line decoding of the original error burst, the original error burst being in a block line encoded data stream.

When the extended error burst is due to block line decoding, the block line decoding can be performed according to an 8B/10B code which effects conversion between an 8 bit domain and a 10 bit domain during data transmission. In that case, the extended error burst can span a plurality of sub-codes in the same character, or a plurality of sub-codes in a plurality of characters in the 8B/10B code.

The r-bit error detecting code can be an r-bit cyclic redundancy check (CRC) code. The r-bit CRC code can be designed to detect a set of extended error burst patterns. The extended error burst patterns can include block line decoding extended error burst patterns characterized in relation to the number and/or location of errored sub-codes in the original error burst. The r-bit error detecting code can be capable of detecting any error based on the original error burst, even when an extended error burst length is not greater than the original error burst length. The extended error burst detector can include an error detecting code capable of detecting any extended error burst due to the data transmission processing.

The data stream input, or data stream receiver, can include: a block line decoder; a de-interleaver; and/or one or more decision feedback equalizer receivers.

In another aspect, the present invention provides a transmitter for use in a data interface, including an unencoded data stream input to receive an unencoded data stream. An extended error burst code generator is provided, in communication with the unencoded data stream input, to modify the unencoded data stream so that an original error burst in an encoded data stream can be detected after data transmission processing, the data transmission processing causing the original error burst to extend to an extended error burst in a decoded data stream. The extended error burst has a length greater than an original error burst length. A data stream transmitter is also provided to transmit an output of the extended error burst code generator to a data destination.

In a further aspect, the present invention provides a transceiver for use in a data interface, including the following elements: an unencoded data stream input to receive an unencoded data stream; an extended error burst code generator, in communication with the unencoded data stream input, to modify the unencoded data stream so that an original error burst in an encoded data stream can be detected after data transmission processing; a data stream transmitter to transmit an output of the extended error burst code generator; a data stream receiver to receive a transmission processed data stream; an extended error burst detector, in communication with the data stream receiver, to detect an extended error burst in the received transmission processed data stream, the extended error burst having been extended beyond an original error burst length due to the data transmission processing; and an error-checked data stream output, in communication with the extended error burst detector, to output an error-checked data stream to a data destination.

As signal rates increase in the field of communications, signal integrity becomes more difficult to maintain. DFE receivers provide a proven technique for handling much of this signal degradation, and hence are expected to become increasingly important. DFE receivers have size and power advantages on difficult channels relative to linear equalizers. The present invention provides error detection that is capable of detecting the types of error bursts that can result from DFE receiver mis-decoding, 8B/10B block decoding, etc., over a multi-lane data interface. As multi-lane data interfaces are increasingly common, the present invention will become correspondingly more important.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached figures, wherein.

DETAILED DESCRIPTION

Figure 1:
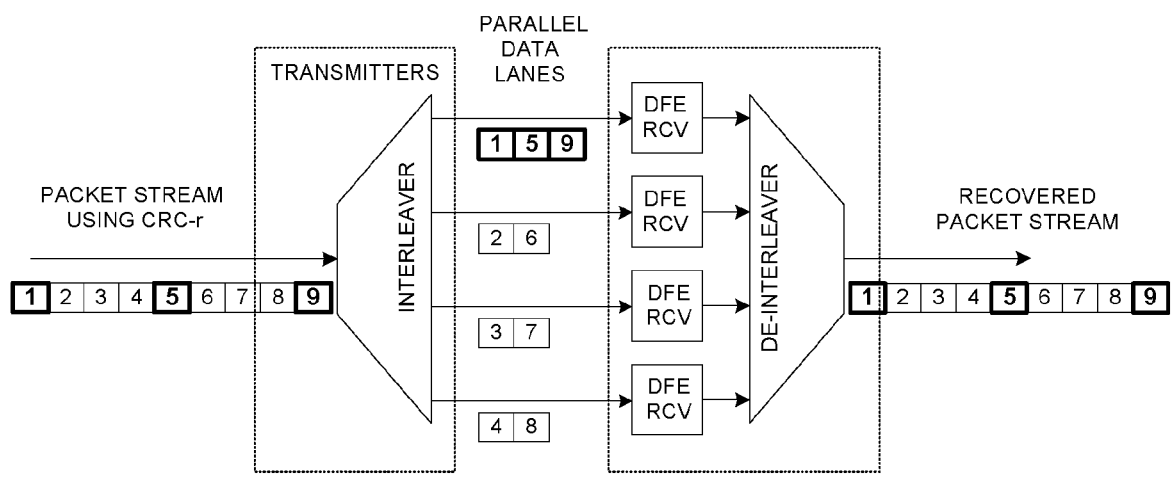
FIG. 1 illustrates byte/character-interleaving in a multi-lane data interface.
Figure 2:
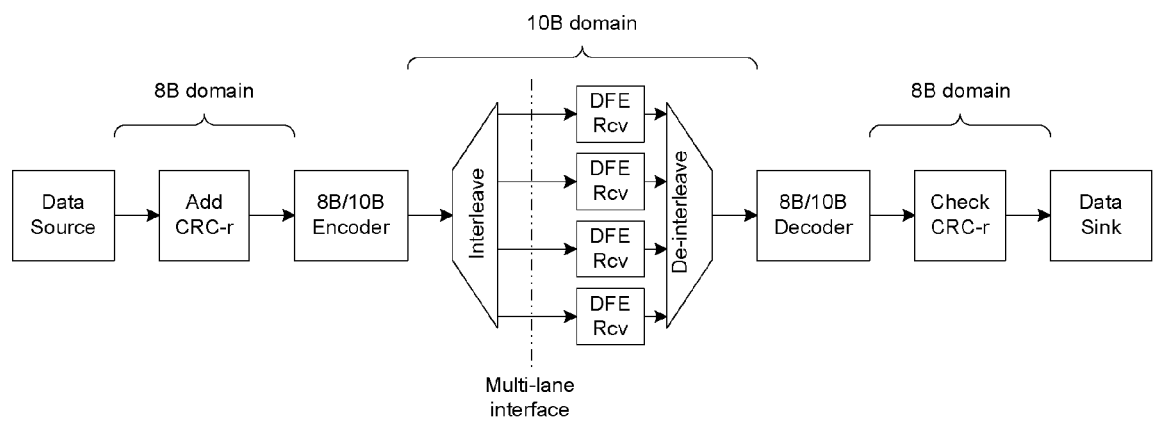
FIG. 2 is a block diagram illustrating where line code and error detecting code processing are performed with respect to an end-to-end data interface connection.

Generally, the present invention provides a system and method to detect an extended error burst in a data interface. An original error burst has a given length prior to or during transmission. Data transmission processing can extend the original error burst beyond its original length to become an extended error burst with an effective length greater than the original error burst length. Such data transmission processing can include: de-interleaving data on a multi-lane data interface; feedback from a DFE receiver; and/or block line decoding, such as 8B/10B block line code decoding. An extended error burst detector can include a suitable error detecting code, such as an r-bit CRC code developed in relation to known extended error burst patterns, to detect all extended error bursts based on an up to r-bit original error burst. The detector can also detect error bursts that are not extended beyond the original error burst length.

The term "extended error burst" refers to an error burst that has been extended, spread, expanded, stretched or multiplied beyond an original error burst length due to transmission processing. The original error burst occurs in encoded data during data transmission processing, and typically occurs in the transmission channel. The extended error burst appears in data after decoding. An extended error burst comprises one or more "error regions". In general, any or all of the bits in an error region can contain errors. Therefore, the length of an extended error burst can be defined as: the number of bits from the first errored bit to the last errored bit; or the number of bits from the first bit in the first error region to the last bit in the last error region. The term "extended error burst pattern" refers to a sequence or pattern of error regions and regions of good data in an extended error burst.

Extension due to transmission processing can include: error spreading due to splitting a error burst through de-interleaving data on a multi-lane data interface; error multiplication due to feedback from a DFE receiver; and error multiplication due to block line decoding, such as 8B/10B block line code decoding. Embodiments of the present invention provide advantages for any of these transmission processing scenarios on their own, and are more advantageous when two or three of these scenarios are combined.

For example, a data source on a multi-lane interface interleaves data across the multiple lanes, with the interleaving typically done on a byte or character basis. Hence, an error burst on a single lane can be split apart, effectively spreading it into a longer burst in the received data when it is de-interleaved to re-assemble the original data. (The data from the other lanes is placed between the portions of the error burst.) The result of this splitting is that the error burst becomes a longer burst from the perspective of error detection. When 8B/10B block line coding is used, the original error bursts are further multiplied by the 8B/10B decoding process. Further, one source of error bursts is DFE receivers, which can convert each individual transmission channel error into a burst of multiple errors due to the feedback mechanism that is part of the DFE receiver.

In embodiments of the present invention, CRC error detecting codes are discussed as being presently preferred. However, it is to be understood that alternative embodiments can use any type of error detecting code. CRC error detecting codes that are commonly used for packetized data are chosen for their ability to detect either some number of the randomly occurring single bit errors (e.g., <4) or a single burst of errors. Embodiments of the present invention use a CRC code designed to detect this type of extended error burst, such as in multi-lane implementations, including those that can be induced by a DFE receiver and/or 8B/10B decoding. By using knowledge of a limited universe of error patterns, a extended error burst CRC-r code of r-bit length can detect an up to r-bit long original error burst, even when spread apart by n lanes. Using known approaches, in an n lane environment, a CRC code of length n*(r−1) would be required to detect error bursts of r-bits in length. For a 4-lane environment to detect 16-bit bursts, this is a difference between a 16-bit CRC and a 60-bit CRC.

Error multiplication across two characters did not generally occur in systems conforming to an older version of the RapidIO™ interface standard that introduced this concept of parallel lanes (or multi-lanes), since it did not use an 8B/10B code. Moreover, it was not designed to interact at higher speeds and with DFEs to handle high rates and interacting with block codes.

Figure 3:
FIG. 3 illustrates multi-character error burst spreading resulting from de-interleaving the data in a multi-lane interface.
Figure 3:
Figure 3:
Figure 3:
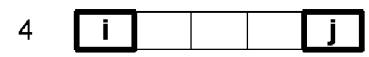
Figure 3:
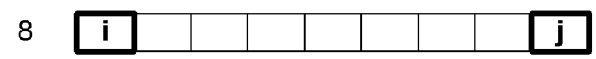
Figure 3:
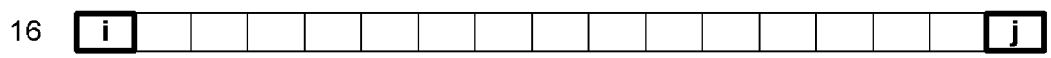
Figure 3:

In an embodiment, the method and system of the present invention can include a class of CRC codes that are specifically designed for the multi-lane data interfaces illustrated in FIG. 1. A schematic is shown in FIG. 3 illustrating multi-character error burst spread resulting from de-interleaving data in a multi-lane interface. A result of using multiple data lanes is that when an error burst at the receiver of a single lane affects two adjacent characters, these characters will no longer be adjacent after the de-interleaving process. The resulting error spread is illustrated in FIG. 3. As a result of the error spread, error bursts of effectively 2, 3, 5, 9, and 17 characters result for interfaces with 1, 2, 4, 8, and 16 data lanes, respectively.

Figure 4:
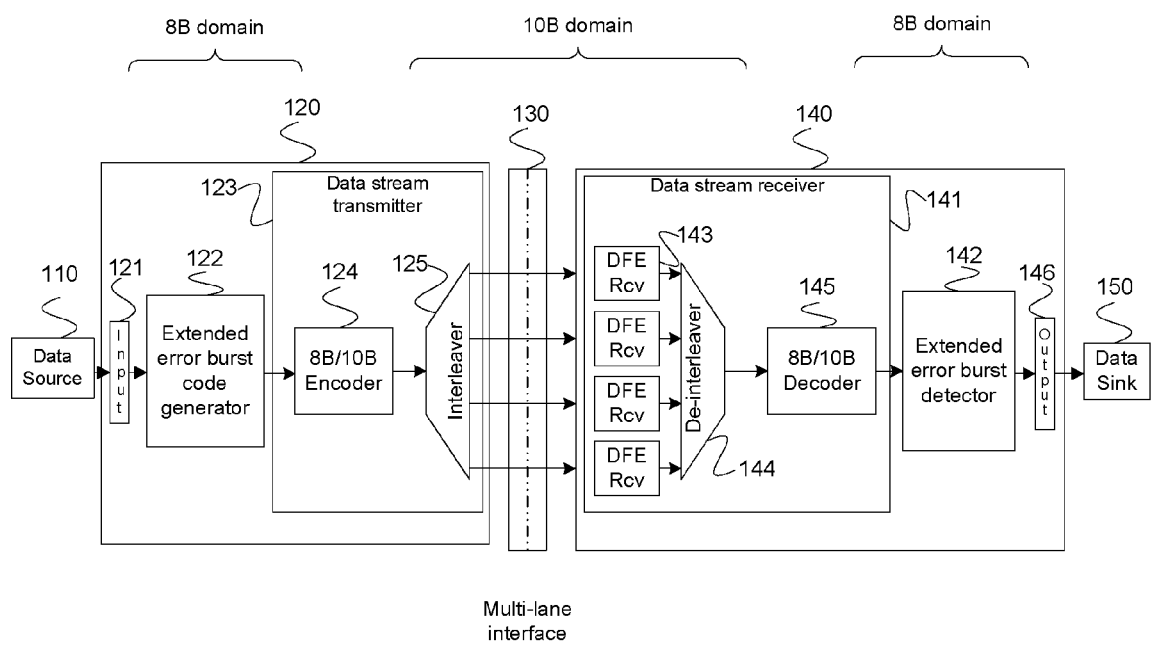
FIG. 4 is a block diagram illustrating a data interface according to an embodiment of the present invention.

FIG. 4 shows an embodiment of the present invention in a network and using an error detecting code for detecting errors on multi-lane, 8B/10B block coded data interfaces. A data source 110 provides unencoded data to a transmitter or data encoder 120, such as via an unencoded data stream input 121. The transmitter includes an extended error burst code generator 122 and a data stream transmitter 123. The extended error burst code generator 122 inserts an error detecting code to be appended to the unencoded data stream, and can be referred to as an extended error burst detection initiator, or an extended error burst code inserter. The error detecting code is added before block line encoding and interleaving, if applicable. The extended error burst code generator 121 can be implemented as an "Add CRC-r" module that adds an r-bit error detecting code, or CRC polynomial. The CRC code is capable of detecting any error burst after transmission processing when the original error is up to r bits long in an original data stream, regardless of whether or to what extent the original error burst has been extended. The extended error burst code generator 121 can comprise a machine-readable memory storing the optimized CRC code, or polynomial.

The data stream transmitter 123 is any means suitable to transmit the output of the extended error burst code generator 122. In this embodiment, the data stream transmitter 123 includes a block line encoder 124 such as an 8B/10B encoder, and an interleaver 125. The transmitter 120 sends the encoded and interleaved data over a network 130, which in this case comprises a multi-lane interface. The multi-lane interface can be described as a physical medium that separates two end points. Examples of a multi-lane interface include a backplane and a motherboard.

A receiver or data decoder 140 in FIG. 4 includes a data stream receiver 141 to receive a transmission processed data stream from the network, and an extended error burst detector 142. The data stream receiver can be a data stream input. In this embodiment, the data stream receiver 141 includes a plurality of DFE receivers 143 (as many as there are lanes), a de-interleaver 144, and a block line decoder 145, such as an 8B/10B decoder. The extended error burst detector 142 detects an extended error burst in the received transmission processed data stream, or decoded data stream, the extended error burst having an effective length greater than an original error burst length due to the data transmission processing. The output of the extended error burst detector 142 is passed on, such as via an error-checked data stream output 146, to a data sink 150, or data destination.

The extended error burst detector 142 can comprise a machine-readable memory storing en error detecting code that corresponds to the code stored in the extended error burst code generator 122. In an embodiment, the extended error burst detector 142 can be implemented as a "Check CRC-r" module that includes the CRC polynomial from the corresponding "Add CRC-r" module. Examples of suitable CRC polynomials that can be used in the "Add CRC-r" and "Check CRC-r" modules will be described later. As a result of using these polynomials, any of the expected multiplied error bursts will be detected. The circuits to implement the "Add CRC-r" and "Check CRC-r" modules can use any type of CRC circuit implementation well known to one of ordinary skill in the art and those details are not presented herein.

While embodiments of the present invention provide an advantage over known implementations by detecting extended error bursts longer than the original error burst, presently preferred embodiments can also detect error bursts where the effective length is no longer than the original error burst. In other words, the extended error burst detector can detect any extended error burst due to the data transmission processing.

In some implementations, the data interface can be bi-directional. In that case, the transmitter 120 and the receiver 140 can be integrally provided within a transceiver. In such a case, the transceiver can be described generally as a data interface device including the transmitter, receiver and all of their constituent elements.

Presently preferred embodiments of the present invention use CRC for detecting errors on multi-lane, 8B/10B block coded data interfaces. In the specific context of an 8B/10B error code and a DFE, 8B/10B codes are comprised of two sub-codes (5B/6B and 3B/4B). If the tail end of one character is corrupted as well as the beginning of another, the error has hit a 5B and a 3B code and created errors in both sub-codes. The amount of corruption is determined by the characteristics of the line code. However, there is a limited number of corruption scenarios or error burst patterns. Knowledge of the limited error burst patterns allows the use of a much simpler CRC than if this characteristic is not taken into account. While it is generally known that a limited number of outcomes exists, determining the actual set of outcomes can assist in designing a CRC that is specific to detecting errors taking into account the specific expected outcomes, and not others.

In a presently preferred embodiment, the r-bit error detecting code, such as a CRC code, is designed to detect these known error burst patterns, which can be referred to as a set of extended error burst patterns. The CRC code can be developed in relation to, characterized in relation to, based on, and/or optimized for the set of extended error burst patterns.

In general, prior to decoding and/or de-interleaving, an original error burst in an encoded data stream can be confined within a single character, or spread over two or three adjacent characters. If the data interface is in a multi-lane environment, an error burst in two adjacent characters is spread as shown in FIG. 3. When considering embodiments in which block line encoding, such as 8B/10B encoding, is used, the universe of possible error outcomes or error burst patterns after decoding/ interleaving can be more accurately defined.

FIGS. 5A-5F illustrate such error burst patterns characterized by the number and/or location of sub-codes affected by the original error burst, and resulting from the combination of a DFE receiver and 8B/10B decoding are shown. FIGS. 5A-5F indicate the length and placement, or size and location, of various original error bursts in an encoded data stream and the resulting extended error bursts in a decoded data stream after 8B/10B decoding. This is in contrast to known approaches which typically characterize an error burst only in relation to its total bit length. It is worth noting that a longer original error burst does not automatically result in a longer extended error burst. For example, an incoming burst of up to 10 bits can create burst patterns in FIGS. 5A and 5B, but it takes incoming burst of only 6 bits to create a more severe error pattern, i.e. a 6-bit burst can create error pattern as in FIG. 5C. Similarly, while incoming error bursts of up to 20 bits can create error patterns as in FIGS. 5E and 5F, a burst of 17 bits can create an error pattern that will affect four bytes.

Data in FIGS. 5A-5F are grouped in 8 or 10-bit characters. Double slash lines between the characters are used to indicate that while these characters are adjacent to each other on that lane, they can be spread apart in the final data packet based on the number of lanes, as illustrated in FIGS. 1 and 3. Also in FIGS. 5A-5F, the leftmost characters are the first to arrive, followed by the middle ones, then the right ones. Time progresses from left to right, and each "column" shows a different character, with three characters shown in the different time periods.

Figure 5A:
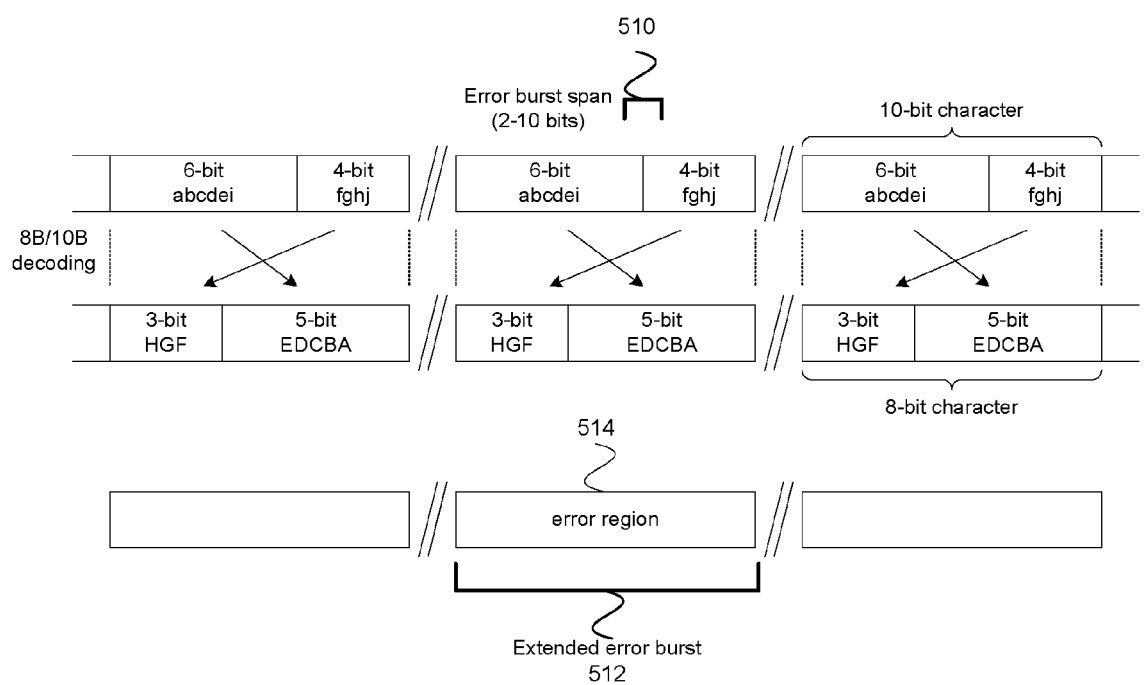
FIGS. 5A-5F are schematics illustrating error burst patterns characterized by the number and/or location of affected sub-codes, such as resulting from the combination of a DFE receiver and 8B/10B decoding, according to embodiments of the present invention.
Figure 5B:
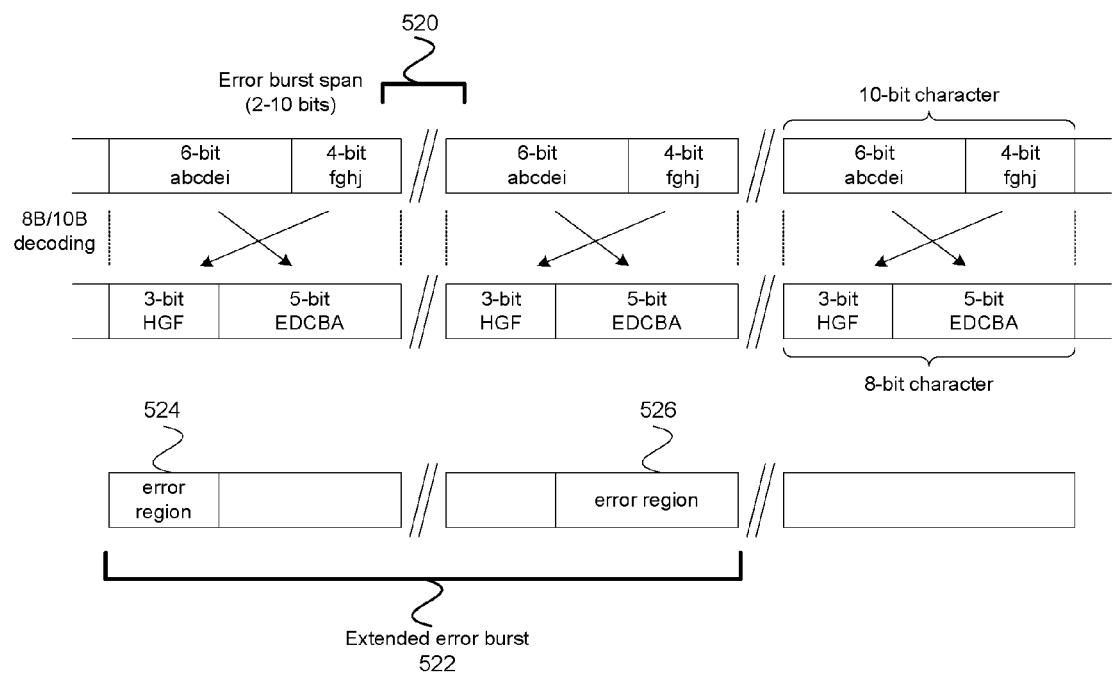

FIGS. 5A and 5B illustrate original error bursts spanning two sub-codes, and their resulting extended error burst patterns. In FIG. 5A, original error burst 510 spans two sub-codes in the same character in the encoded data stream. Therefore, even a CRC-8 is good enough to detect this error, since there is no spreading. The receiver burst length of this error can be as few as 2 bits, and in the range of 2-10 bits. Since both sub-codes are errored and transposed during block line decoding, the error burst pattern for extended error burst 512 in the decoded data stream includes an error region 514 that covers the entire character (8-bits in this case).

As such, even without lane spreading, the original error burst 510 has been expanded to the error region 512, except in the case where the original error burst is 8-10 bits long. For all original error burst lengths of this type, the original error burst is expanded due to lane spreading and the presence of DFEs. The error burst extension due to the DFE receiver occurs prior to the 8B/10B decoder, which is prior to the de-interleaver. Consequently, a single transmission channel error (i.e. an error burst with length of 1 bit) can be spread into a burst by the DFE receiver. This error burst output from the DFE receiver then affects the one or more 8B/10B sub-codes. Of course, a 2-bit error can also be confined to being within the same sub-code, in which case the error remains within the same transposed sub-code and does not affect the other sub-code in that character.

In FIG. 5B, original error burst 520 spans two sub-codes in two adjacent characters. The receiver burst length of this error can be as few as 2 bits, and in the range of 2-10 bits. Specifically in FIG. 5B, the error burst occurs in the tail end of one 10 bit character and the beginning of the next 10 bit character. The error burst pattern for extended error burst 522 includes error regions 524 and 526 which are spread to the respective ends of the two affected bytes due to swapping when switching domains in the 8B/10B decoding. The double lines at the bottom of the figure indicate the spreading caused by the number of lanes, with a certain number of good bytes inserted from another lane in between the errored sub-codes. For example, in an n-lane environment, the error burst pattern for the extended error burst 522 includes the error region 524 in the first 3 bit section, followed by 5 bits of good data, another n−1 lanes worth of good data, 3 bits of good data, then the error region 526 including up to 5 bits of corrupted data.

As such, even without lane spreading, the original error burst 520 has been expanded to the error region 522, which is 16-bits in length, in comparison to the original error burst length of 2-10 bits. The original error burst is expanded even further due to lane spreading and the presence of DFEs.

Figure 5C:
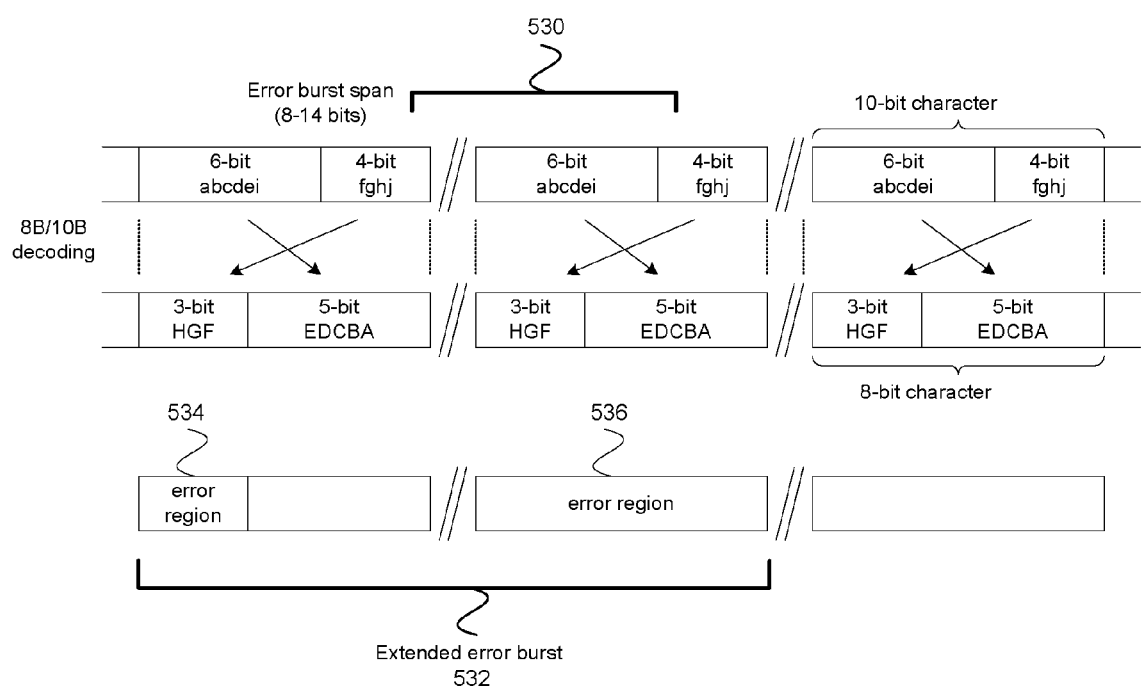
Figure 5D:
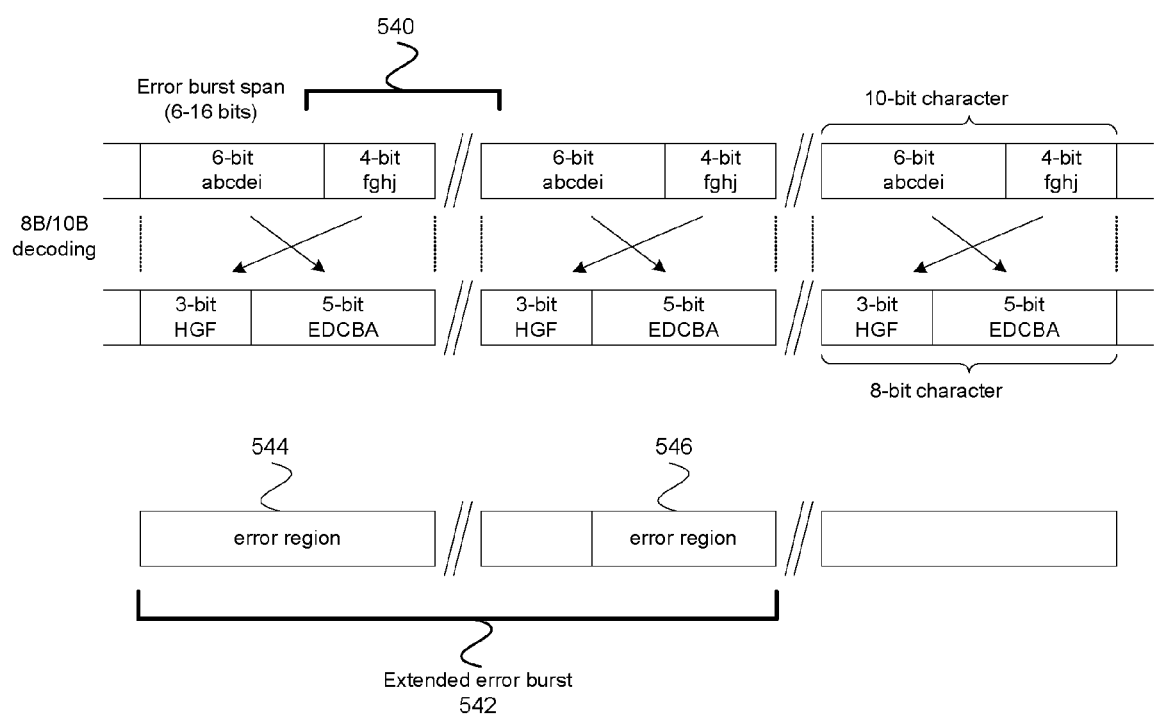

FIGS. 5C and 5D illustrate original error bursts spanning three sub-codes in two characters, and their resulting extended error burst patterns. In FIG. 5C, original error burst 530 spans the last sub-code of one character and both sub-codes of the next character. This original error burst has a length of at least 8 bits, and can be in the range of 8-14 bits. The error burst pattern for the resulting extended error burst 532 includes error regions 534 and 536 separated by a non-errored region and by n lanes of data. As such, even without lane spreading, the original error burst 530 has been expanded to the size of the extended error burst 532, which is 16-bits in length, in comparison to the original error burst length of 8-14 bits. The original error burst is expanded even further due to lane spreading and the presence of DFEs.

In FIG. 5D, original error burst 540 catches both sub-codes of one character and the first sub-code of the next character. The original error burst 540 has a length of at least 6 bits, and can be in the range of 6-16 bits. The error burst pattern for the resulting extended error burst 542 includes error regions 544 and 546 separated by a non-errored region and by n lanes of data. As such, even without lane spreading, the original error burst 540 has been expanded to the size of the extended error burst 542, which is 16-bits in length, in comparison to the original error burst length of 6-16 bits (except when the original error burst is 16 bits long, in which case there is no expansion due to block line decoding). For all original error burst lengths of this type, the original error burst is expanded due to lane spreading and the presence of DFEs.

Figure 5E:
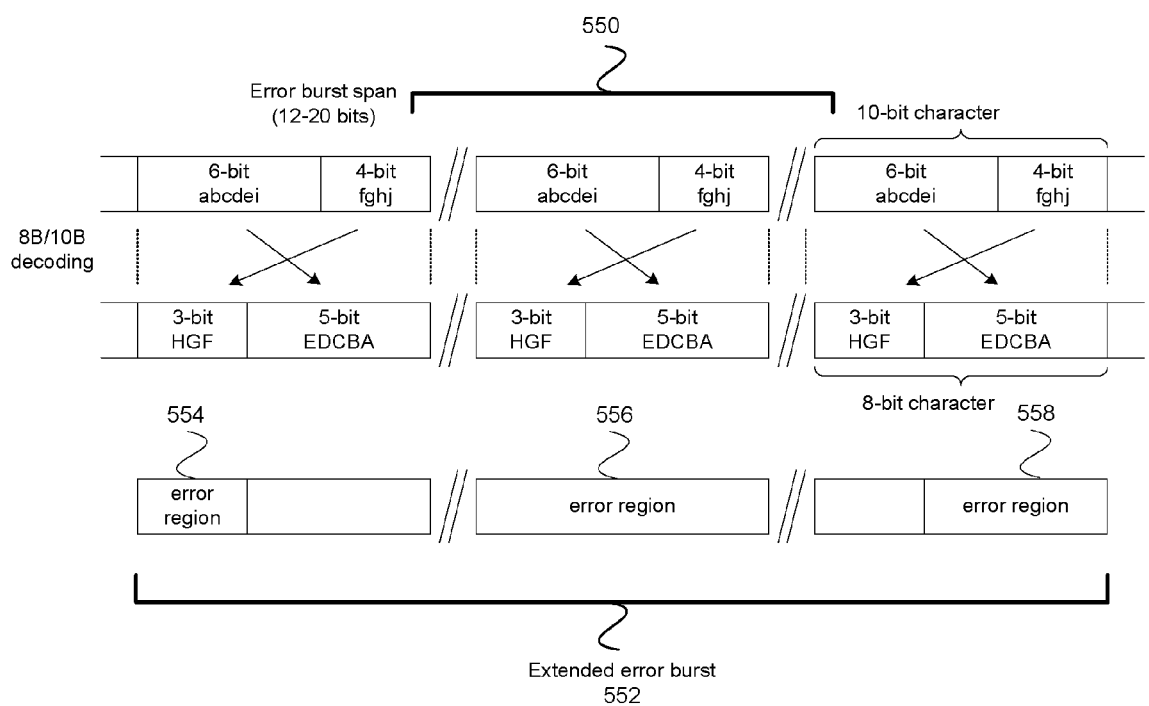
Figure 5F:
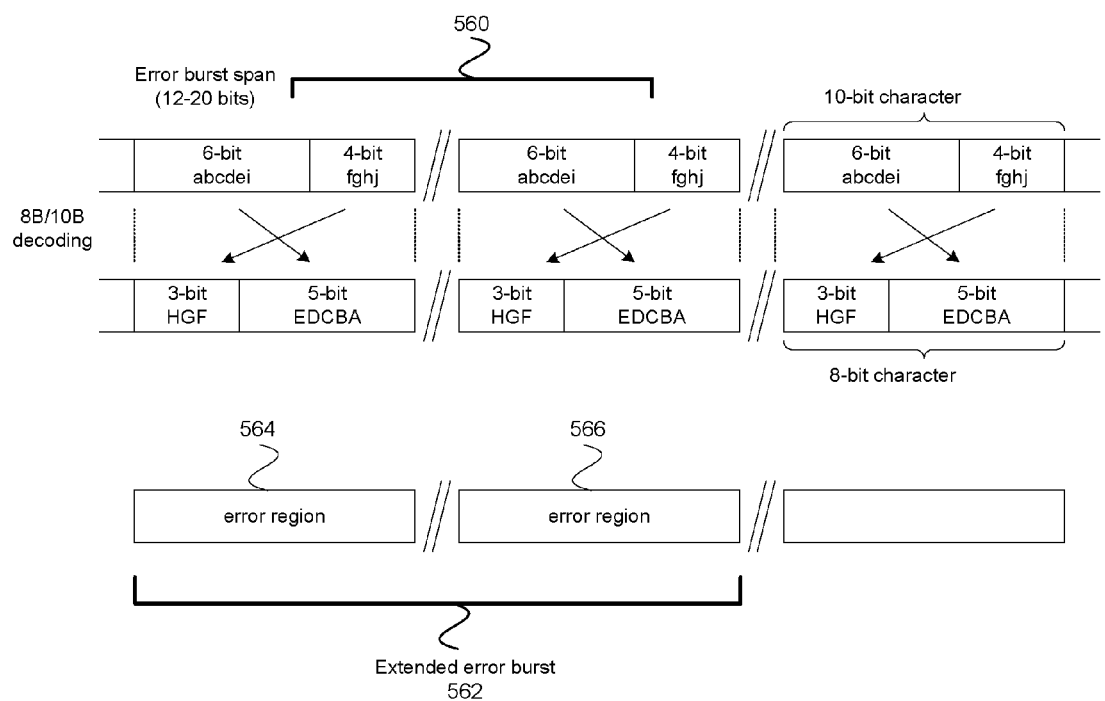

FIGS. 5E and 5F illustrate error bursts spanning four sub-codes, and their resulting extended error burst patterns. In FIG. 5E, original error burst 550 spans the last sub-code of one character, both sub-codes of the next character, and the first sub-code of the following character. The error burst pattern for the resulting extended error burst 552 spans three entire characters and includes error regions 554, 556 and 558, separated from each other by regions of good data. As such, even without lane spreading, the original error burst 550 has been expanded to the size of the extended error burst 552, which is 24-bits in length, in comparison to the original error burst length of 12-20 bits. The original error burst is expanded even further due to lane spreading and the presence of DFEs.

In FIG. 5F, original error burst 560 catches both sub-codes of two successive characters, and has an original error burst length of 12-20 bits. The error burst pattern for the resulting extended error burst 562 includes error regions 564 and 566, and spans two entire characters. As such, even without lane spreading, the original error burst 560 is expanded to the size of the extended error burst 562, except when the original error burst is 17-20 bits long, in which case there is no expansion. For all original error burst lengths of this type, the original error burst is expanded due to lane spreading and the presence of DFEs.

CRC polynomials of presently preferred embodiments of this invention have been designed to detect an error burst on n-lane data interfaces for n=1, 2, 4, 8, 16, 32, and 64. Typical values of n are currently 1, 2, 4, 8, and 16. Specifically, these CRC polynomials are capable of detecting all error bursts of lengths approaching the codes' normal error burst limitation when the error bursts are the result of the combination of DFE receiver and 8B/10B decoder operations.

Most known CRC-16 codes can handle up to a 4 sub-code corruption burst. However, most CRCs in common use were not designed to detect errors spread apart by a length larger than the length of the CRC itself. However, taking into account knowledge regarding error spreading in multi-lane implementations, such as the above-described extended error burst patterns resulting from original error bursts defined in relation to the number/location of affected sub-codes, it is possible to correctly detect a burst error that is longer than the CRC code.

Few previous implementations use parallel lanes with 8B/10B coding, and the ones that did operated at a low enough speed that they did not have DFEs. In rare cases a burst error from the receiver could corrupt multiple sub-codes. Known approaches, however, did not pay much attention to the possibility of such a noise burst and rather treated all errors at the receiver as if they were single bit errors, essentially random errors.

In one presently preferred embodiment of the present invention, the CRC is a CRC-16. An r-bit CRC (CRC-r) can detect any error burst of up to r bits in length. As seen in FIGS. 5B, 5C, 5D and 5F, even for a single data lane, the error bursts 522, 532, 542 and 562 are 16-bit bursts. In FIG. 5E, the error burst 552 is a 24-bit burst. Hence, CRCs with fewer than 16 bits are not suited to this error burst environment. It is possible to use more than 16 bits, but this would result in a loss of efficiency, especially since it is typically preferable to have r be a multiple of 8-bits. The choice of r=16 is appropriate with some limitations on the length of the data blocks that are covered by the CRC-16.

Further, DFE receivers use a limited number of feedback taps, which in practice limits the number of bits in an error burst at the output of the DFE receiver that result from a single transmission channel error. For example, it has been shown that for a DFE receiver with 5 feedback taps, the probability of a DFE output error burst greater than 7 bits is no greater than the probability of having a second transmission channel error. Hence, it is adequate to be able to detect all the final error burst patterns in FIGS. 5A, 5B and 5D that can result from a burst of 7-bits or less from the output of the DFE receiver. Similarly, it has been shown that for a practical 7-tap DFE receiver it is only necessary to detect error bursts of 9 bits or less. If a DFE receiver uses 7 or fewer feedback taps, it is adequate to cover error burst cases of FIGS. 5A-5D.

There are 23796, 21433, and 19824 CRC-16 polynomials that can detect error burst cases 512, 522, 532 and 542 for up to 16, 32, and 64 parallel data lanes, respectively. In order to simplify implementation, polynomials of lower weight are preferred. The polynomial 10000000100000001 is the lowest weight polynomial, and it covers the error bursts for at least up to 64 lanes. Sometimes, however, a polynomial of even weight is preferred due to its ability to detect any odd number of errors in a block. Table 1 shown below gives a complete list of the polynomials satisfying the error burst criteria with a weight of 4, and specifically illustrates the low weight CRC-16 polynomials that can detect error burst cases 512, 522, 532 and 542.

TABLE 1

| Poly-nomial weight | Maximum number of lanes | | |
|---|---|---|---|
| | 16 | 32 | 64 |
| 3 | 10000000100000001 | 10000000100000001 | 10000000100000001 |
| 4 | 10000000000100101 | 10000000000100101 | 10000000000100101 |
| | 10000000000101001 | 10000000000101001 | 10000000000101001 |
| | 10000000000110001 | 10000000000110001 | 10000000000110001 |
| | 10000000001001001 | 10000000001001001 | 10000000001001001 |
| | 10000000001010001 | 10000000001010001 | |
| | 10000000001100001 | | |
| | 10000000010000011 | 10000000010000011 | 10000000010000011 |
| | 10000000010000101 | 10000000010000101 | 10000000010000101 |
| | 10000000010001001 | 10000000010001001 | 10000000010001001 |
| | 10000000010010001 | 10000000010010001 | 10000000010010001 |
| | 10000000010100001 | 10000000010100001 | 10000000010100001 |
| | 10000000011000001 | 10000000011000001 | 10000000011000001 |
| | 10000000100001001 | 10000000100001001 | 10000000100001001 |
| | 10000000100100001 | | |
| | 10000001000000011 | 10000001000000011 | 10000001000000011 |
| | 10000001000001001 | 10000001000001001 | 10000001000001001 |
| | 10000001000010001 | 10000001000010001 | 10000001000010001 |
| | 10000001000100001 | 10000001000100001 | 10000001000100001 |
| | 10000001100000001 | | |

TABLE 1-continued

| Polynomial weight | Maximum number of lanes | | |
|---|---|---|---|
| | 16 | 32 | 64 |
| | 10000010000000011 | 10000010000000011 | 10000010000000011 |
| | 10000010000000101 | 10000010000000101 | 10000010000000101 |
| | 10000010000001001 | 10000010000001001 | 10000010000001001 |
| | 10000010010000001 | 10000010010000001 | 10000010010000001 |
| | 10000011000000001 | 10000011000000001 | 10000011000000001 |
| | 10000100000000101 | 10000100000000101 | 10000100000000101 |
| | 10000100000001001 | 10000100000001001 | 10000100000001001 |
| | 10000100000010001 | 10000100000010001 | 10000100000010001 |
| | 10000100010000001 | 10000100010000001 | 10000100010000001 |
| | 10000100100000001 | | |
| | 10000101000000001 | 10000101000000001 | 10000101000000001 |
| | 10000110000000001 | | |
| | 10001000000000011 | 10001000000000011 | 10001000000000011 |
| | 10001000000000101 | | |
| | 10001000000001001 | 10001000000001001 | 10001000000001001 |
| | 10001000000010001 | 10001000000010001 | 10001000000010001 |
| | 10001000000100001 | 10001000000100001 | 10001000000100001 |
| | 10001000010000001 | 10001000010000001 | 10001000010000001 |
| | 10001001000000001 | 10001001000000001 | 10001001000000001 |
| | 10001010000000001 | | |
| | 10001100000000001 | 10001100000000001 | 10001100000000001 |
| | 10010000000010001 | 10010000000010001 | 10010000000010001 |
| | 10010000000100001 | 10010000000100001 | 10010000000100001 |
| | 10010000001000001 | 10010000001000001 | 10010000001000001 |
| | 10010000010000001 | 10010000010000001 | 10010000010000001 |
| | 10010000100000001 | 10010000100000001 | 10010000100000001 |
| | 10010001000000001 | 10010001000000001 | 10010001000000001 |
| | 10010010000000001 | 10010010000000001 | 10010010000000001 |
| | 10010100000000001 | 10010100000000001 | 10010100000000001 |
| | 10100000000001001 | 10100000000001001 | 10100000000001001 |
| | 10100000000010001 | | |
| | 10100000000100001 | | |
| | 10100000001000001 | 10100000001000001 | 10100000001000001 |
| | 10100001000000001 | 10100001000000001 | 10100001000000001 |
| | 10100100000000001 | 10100100000000001 | 10100100000000001 |
| | 11000000000010001 | 11000000000010001 | 11000000000010001 |
| | 11000000000100001 | 11000000000100001 | 11000000000100001 |
| | 11000000001000001 | 11000000001000001 | 11000000001000001 |
| | 11000000010000001 | 11000000010000001 | 11000000010000001 |
| | 11000001000000001 | 11000001000000001 | 11000001000000001 |

Error burst patterns 552 and 562 from FIGS. 5E and 5F are more difficult, especially as pattern 552 is a 24-bit burst on a single lane system. Again, the polynomial 10000000100000001 can cover each of the cases. There are no polynomials with a weight of 4 that work in these more difficult cases. The lowest even-weight polynomials for up to 16, 32, and 64 lanes have weights of 6, 8, and 12, respectively. (In fact, there are only three polynomials of any weight that can cover error bursts patterns 512, 522, 532, 542, 552 and 562 for up to 64 lanes.) It should be noted that polynomials are typically written in binary number form in this description. The value in each bit location indicates the coefficient value (0 or 1) of that $x^i$ term. For example, 10000000000100101 => $x^{16}+x^5+x^2+1$.

Table 2 below illustrates the low weight CRC-16 polynomials that can detect error burst cases 512, 522, 532, 542, 552 and 562.

TABLE 2

| Polynomial weight | Maximum number of lanes | | |
|---|---|---|---|
| | 16 | 32 | 64 |
| 3 | 10000000100000001 | 10000000100000001 | 10000000100000001 |
| 6 | 10001100010010001 | — | — |

TABLE 2-continued

| Polynomial weight | Maximum number of lanes | | |
|---|---|---|---|
| | 16 | 32 | 64 |
| 7 | 10010001100010011 | 10010001100010011 | 10010001100010011 |
| | 11001000110001001 | 11001000110001001 | |
| | 10000000111010101 | | |
| | 10010001100010011 | | |
| | 10011001100000101 | | |
| 8 | 10110000100010111 | 10110000100010111 | — |
| | 11001111000000101 | 11001111000000101 | |
| | 10000011100001111 | | |
| | 10001101000011011 | | |
| | 10011010100001011 | | |
| | 10110000100010111 | | |
| | 10110001100001101 | | |
| | 11001000110001001 | | |
| | 11001111000000101 | | |
| | 11011100000010011 | | |
| | 11100010100100101 | | |
| 12 | — | — | 10100111011111011 |

As an alternative to the embodiment described above, it is possible to choose a CRC-r such that r is a minimum to detect the maximum error burst expected from a particular DFE receiver. Such an embodiment may not be as convenient because the r is often chosen as a multiple of 8-bits for convenience in the data processing path. In some cases, however, it is more important to minimize the number of CRC check bits (in order to maximize the number of information bits) rather than to maintain the 8-bit multiple. A CRC-13 has been determined to be the minimum length CRC capable of detecting error bursts for the error cases of FIGS. 5A-5D, in spite of the fact that these error patterns are 16 bits long in the single lane case. The choice of the best CRC-13 polynomial depends on the length of the packet to be checked, the maximum number of lanes, and implementation complexity. Some of the best polynomials are listed in Table 3 below. The polynomial $x^{13}+x^{10}+x^8+x^5+x^2+1$ (10010100100101) has been chosen for the RapidIO™ interface extended (6 byte) control symbol due to the efficient, low-latency parallel implementation it allows. RapidIO™ technology is registered trademark of the "RapidIO Trade Association" of Austin, Tex. and represents a scalable, packet-switched, high-performance fabric specifically developed to address the needs of equipment designers in the wireless infrastructure, edge networking, storage, scientific, military and industrial markets. Under active development since June 1997, the RapidIO standard represents continued commitment of the RapidIO Trade Association to addressing the needs of the ever changing networking and communications marketplace.

Table 3, shown below, represents the presently preferred CRC-13 polynomials.

TABLE 3

| Polynomial | Max. Number of Lanes | Effective Maximum Packet Length | Comments |
|---|---|---|---|
| 11000100100001 | 16 | 31 bytes | This is the lowest weight polynomial that can detect the error bursts. |
| 10010100100101 | ≧512 | 63 bytes* | This polynomial has a very sparse generator matrix for shorter packets, which allows efficient parallel |

TABLE 3-continued

| Polynomial | Max. Number of Lanes | Effective Maximum Packet Length | Comments |
|---|---|---|---|
| 11100001110111 | 128 | 103 bytes* | implementations with smaller circuits and low latency. If the two 10B error detection criterion is important (see table note), this polynomial supports the longest packet lengths. |
| 10111100101111 | ≧512 | 63 bytes* | These polynomials also yield very efficient parallel implementations for shorter packets. |
| 11011100110111 | ≧512 | 63 bytes* | |
| 10100100101001 | ≧512 | 63 bytes* | |

*The maximum lengths here are based on a secondary criterion of being able to detect two 10B-domain errors in the absence of DFE-induced error multiplication. Otherwise, there is no packet length limit for these polynomials for systems including up through 512 data lanes.

The parallel logic implementation equations for RapidIO™ extended control symbol CRC-13 are shown in Table 4. An "X" in a row of the table indicates that the message bit of that column is an input to the Exclusive-OR (XOR) equation for calculating the CRC bit of that row. For example, $c_0 = D_4(+)D_6(+)D_9(+)D_{14}(+)D_{19}(+)D_{21}(+)D_{23}(+)D_{25}(+)D_{26}(+)D_{27}(+)D_{29}(+)D_{30}(+)D_{32}$, where '(+)' is used here to indicate the XOR logic operation. Here, consistent with RapidIO™ convention, data bit 0 is the most significant bit (MSB) of the data, and CRC bit c0 is the MSB of the CRC. It should be noted that the parallel implementation matrix applies to applications where all packets are the same length. For such applications, the CRC value is first computed for each of the possible data words with a weight of 1 (i.e., the CRCs associated with a 1 in each of the data bit positions). If the CRC bit $c_i$ contains a 1 as a result of the remainder for a 1 in data bit $D_k$, then bit $D_k$ is an input to the XOR equation for $c_i$. This method of parallel implementation uses the property of superposition that is inherent in linear codes such as the CRC.

Table 4, shown below, illustrates the parallel logic equations for the 8-character control symbol.

TABLE 4

| Control Symbol Data for CRC | CRC Checksum Bits | | | | | | | | | | | | |
|---|---|---|---|---|---|---|---|---|---|---|---|---|---|
| | c0 | c1 | c2 | c3 | c4 | c5 | c6 | c7 | c8 | c9 | c10 | c11 | c12 |
| D0  |   | X |   |   | X |   | X |   |   | X |   |   |   |
| D1  |   |   | X |   |   | X |   | X |   |   | X |   |   |
| D2  |   |   |   | X |   |   | X |   | X |   |   | X |   |
| D3  |   |   |   |   | X |   |   | X |   |   |   |   | X |
| D4  | X |   |   | X |   |   |   | X | X |   | X |   |   |
| D5  |   | X |   |   | X |   |   |   | X | X |   |   | X |
| D6  | X |   | X | X |   |   |   | X |   | X |   |   |   |
| D7  |   | X |   | X | X |   |   |   | X |   | X |   |   |
| D8  |   |   | X |   | X | X |   |   |   | X |   |   | X |
| D9  | X |   |   |   |   | X |   | X |   |   |   |   |   |
| D10 |   | X |   |   |   |   | X |   | X |   |   |   |   |
| D11 |   | X |   |   |   |   |   | X |   | X |   |   |   |
| D12 |   |   | X |   |   |   |   |   | X |   | X |   |   |
| D13 |   |   |   | X |   |   |   |   |   | X |   |   | X |
| D14 | X |   |   | X |   |   | X |   |   |   |   |   |   |
| D15 |   | X |   |   | X |   |   |   |   | X |   |   |   |
| D16 |   |   | X |   |   | X |   |   |   |   | X |   |   |
| D17 |   |   |   | X |   |   | X |   |   |   |   | X |   |
| D18 |   |   |   |   | X |   |   | X |   |   |   |   | X |
| D19 | X |   |   | X |   |   |   |   |   |   |   | X |   |
| D20 |   | X |   |   | X |   |   |   |   |   |   |   | X |
| D21 | X |   | X | X |   |   |   | X |   |   | X |   |   |
| D22 |   | X |   | X | X |   |   |   | X |   |   | X |   |
| D23 | X |   | X | X | X |   |   | X |   |   | X | X |   |
| D24 |   | X |   | X | X | X |   |   | X |   |   | X | X |
| D25 | X |   | X | X | X | X | X |   | X |   | X | X | X |
| D26 | X | X |   |   | X |   |   | X | X | X |   |   | X |
| D27 | X | X | X | X |   |   |   |   |   | X | X | X |   |
| D28 |   | X | X | X | X |   |   |   |   | X | X | X | X |
| D29 | X |   | X |   | X |   |   | X |   |   |   |   | X |
| D30 | X | X |   |   |   | X | X |   |   | X |   |   |   |
| D31 |   | X | X |   |   |   | X | X |   |   | X |   |   |
| D32 | X |   | X |   | X |   |   | X |   | X |   |   |   |
| D33 |   | X |   | X |   | X |   |   | X |   | X |   |   |
| D34 |   |   | X |   | X |   | X |   |   | X |   | X |   |

Figure 6:
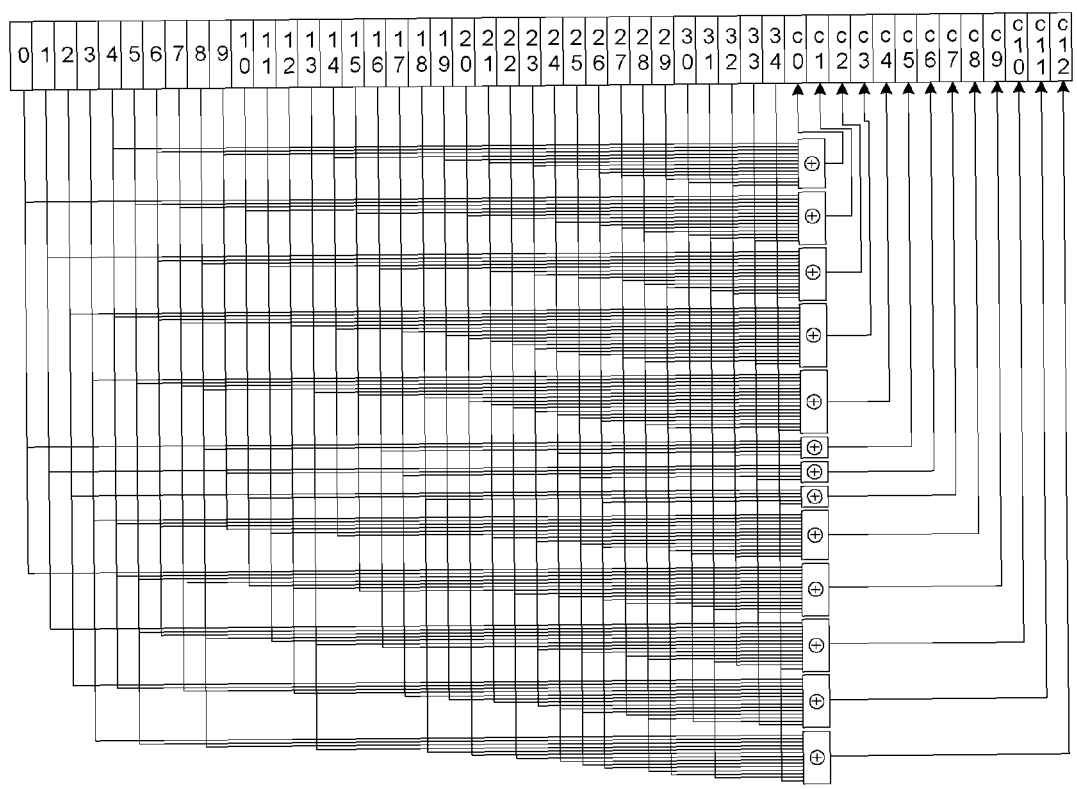
FIG. 6 is a schematic illustrating an embodiment of CRC generator and check circuit: Parallel CRC-13 circuit for the RapidIO control symbol application.

A presently preferred implementation of the present invention for the CRC-13 used in the RapidIO™ interface is the parallel implementation of a CRC generator and check circuit illustrated in FIG. 6. In this application, the error detection code is applied incorporated into the 48-bit control symbol. The 35 bit information field provides the input to the 13 Exclusive OR summation gates, the output of which are the 13 CRC check bits. This implementation is applicable to any integrated circuit developed for 5/6 Gbit/s RapidIO™ interfaces.

In the above description, for purposes of explanation, numerous details have been set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention. For example, specific details are not provided as to whether the embodiments of the invention described herein are implemented as a software routine, hardware circuit, firmware, or a combination thereof.

Embodiments of the invention may be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine readable medium may interface with circuitry to perform the described tasks.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A receiver for use in a data interface, comprising:
   a data stream input to receive a transmission processed data stream;
   an extended error burst detector, in communication with the data stream input, to detect an extended error burst in the received transmission processed data stream, the extended error burst having been extended beyond an original error burst length due to data transmission processing; and
   an error-checked data stream output, in communication with the extended error burst detector, to output an error-checked data stream to a data destination.

2. The receiver of claim 1 wherein the extended error burst detector comprises an r-bit error detecting code capable of detecting the extended error burst, where the original error burst is up to r bits long and the extended error burst is greater than r bits long.

3. The receiver of claim 2 wherein the r-bit error detecting code is capable of detecting the extended error burst when the extended error burst is due to character de-interleaving in a multi-lane data interface.

4. The receiver of claim 2 wherein the r-bit error detecting code is capable of detecting the extended error burst when the extended error burst is due to a decision feedback equalizer receiver.

5. The receiver of claim 3 wherein the r-bit error detecting code is capable of detecting the extended error burst when the extended error burst is due to interaction of a decision feedback equalizer receiver with the character de-interleaving in the multi-lane interface.

6. The receiver of claim 2 wherein the r-bit error detecting code is capable of detecting the extended error burst when the extended error burst is due to block line decoding of the original error burst, the original error burst being in a block line encoded data stream.

7. The receiver of claim 6 wherein the block line decoding is performed according to an 8B/10B code which effects conversion between an 8 bit domain and a 10 bit domain during data transmission.

8. The receiver of claim 6 wherein the extended error burst spans a plurality of sub-codes in the 8B/10B code.

9. The receiver of claim 6 wherein the extended error burst spans a plurality of sub-codes in a plurality of characters in the 8B/10B code.

10. The receiver of claim 3 wherein the r-bit error detecting code is capable of detecting the extended error burst when the extended error burst is due to interaction of block line decoding of the original error burst with the character de-interleaving in the multi-lane interface, the original error burst being in a block line encoded data stream.

11. The receiver of claim 4 wherein the r-bit error detecting code is capable of detecting the extended error burst when the extended error burst is due to interaction of the decision feedback equalizer receiver with block line decoding of the original error burst, the original error burst being in a block line encoded data stream.

12. The receiver of claim 5 wherein the r-bit error detecting code is capable of detecting the extended error burst when the extended error burst is due to interaction of the decision feedback equalizer receiver with the character de-interleaving in the multi-lane interface and with block line decoding of the original error burst, the original error burst being in a block line encoded data stream.

13. The receiver of claim 2 wherein the r-bit error detecting code is an r-bit cyclic redundancy check (CRC) code.

14. The receiver of claim 13 wherein the r-bit CRC code is designed to detect a set of extended error burst patterns.

15. The receiver of claim 14 wherein the set of extended error burst patterns comprises block line decoding extended error burst patterns characterized in relation to a number of errored sub-codes in the original error burst.

16. The receiver of claim 14 wherein the set of extended error burst patterns comprises block line decoding extended error burst patterns characterized in relation to location of errored sub-codes in the original error burst.

17. The receiver of claim 2 wherein the r-bit error detecting code is further capable of detecting any error based on the original error burst, even when an extended error burst length is not greater than the original error burst length.

18. The receiver of claim 1 wherein the extended error burst detector comprises an error detecting code capable of detecting any extended error burst due to the data transmission processing.

19. The receiver of claim 1 wherein the data stream input comprises a block line decoder.

20. The receiver of claim 1 wherein the data stream input comprises a de-interleaver.

21. The receiver of claim 1 wherein the data stream input comprises a decision feedback equalizer receiver.

22. A transmitter for use in a data interface, comprising:
- an unencoded data stream input to receive an unencoded data stream;
- an extended error burst code generator, in communication with the unencoded data stream input, to modify the unencoded data stream so that an original error burst in an encoded data stream can be detected after data transmission processing, the data transmission processing causing the original error burst to extend to an extended error burst in a decoded data stream, the extended error burst having a length greater than an original error burst length; and
- a data stream transmitter to transmit an output of the extended error burst code generator.

23. A transceiver for use in a data interface, comprising:
- an unencoded data stream input to receive an unencoded data stream;
- an extended error burst code generator, in communication with the unencoded data stream input, to modify the unencoded data stream so that an original error burst in an encoded data stream can be detected after data transmission processing;
- a data stream transmitter to transmit an output of the extended error burst code generator;
- a data stream receiver to receive a transmission processed data stream;
- an extended error burst detector, in communication with the data stream receiver, to detect an extended error burst in the received transmission processed data stream, the extended error burst having been extended beyond an original error burst length due to the data transmission processing; and
- an error-checked data stream output, in communication with the extended error burst detector, to output an error-checked data stream to a data destination.

* * * * *